(12) United States Patent  
Ikebe et al.

(10) Patent No.: US 12,439,519 B2  
(45) Date of Patent: Oct. 7, 2025

(54) MOUNTING BOARD AND CIRCUIT BOARD

(71) Applicant: TDK CORPORATION, Tokyo (JP)

(72) Inventors: Kiryu Ikebe, Tokyo (JP); Tomohisa Mitose, Tokyo (JP); Akiko Seki, Tokyo (JP); Susumu Taniguchi, Tokyo (JP); Hisayuki Abe, Tokyo (JP)

(73) Assignee: TDK CORPORATION, Tokyo (JP)

( * ) Notice: Subject to any disclaimer, the term of this patent is extended or adjusted under 35 U.S.C. 154(b) by 251 days.

(21) Appl. No.: 18/037,130

(22) PCT Filed: Nov. 15, 2021

(86) PCT No.: PCT/JP2021/041912  
§ 371 (c)(1),  
(2) Date: May 16, 2023

(87) PCT Pub. No.: WO2022/107719  
PCT Pub. Date: May 27, 2022

(65) Prior Publication Data  
US 2024/0008183 A1    Jan. 4, 2024

(30) Foreign Application Priority Data  
Nov. 19, 2020   (JP) .................. 2020-192498

(51) Int. Cl.  
*H05K 1/14* (2006.01)  
*H05K 3/34* (2006.01)

(52) U.S. Cl.  
CPC ........... *H05K 1/144* (2013.01); *H05K 3/3447* (2013.01); *H05K 2201/042* (2013.01); *H05K 2201/10189* (2013.01)

(58) Field of Classification Search  
CPC .............. H05K 1/144; H05K 3/3447; H05K 2201/042; H05K 2201/10189  
(Continued)

(56) References Cited

U.S. PATENT DOCUMENTS

| | | | |
|---|---|---|---|
| 2002/0135063 A1* | 9/2002 | Alcoe ................... | H01L 21/563 257/734 |
| 2017/0179022 A1* | 6/2017 | Matsumoto ........... | H01L 23/528 |

(Continued)

FOREIGN PATENT DOCUMENTS

| | | |
|---|---|---|
| JP | S55-132951 U | 9/1980 |
| JP | 2003-197822 A | 7/2003 |

(Continued)

OTHER PUBLICATIONS

Jan. 11, 2022 Search Report issued in International Patent Application No. PCT/JP2021/041912.

(Continued)

*Primary Examiner* — Andargie M Aychillhum  
(74) *Attorney, Agent, or Firm* — Oliff PLC

(57) ABSTRACT

A mounting board includes: an electronic component including at least a pair of first terminals; and a circuit board including at least a pair of second terminals. The first terminals and the second terminals are electrically joined by a joining material containing a metal element, the electronic component and the joining material are disposed within a wall made of an insulator, a lower surface of the electronic component is lower than an upper surface of the wall, and when long sides of a region surrounded by the wall have a dimension d1 and long sides of the electronic component have a dimension d2, a value of (dimension d1−dimension d2) is 10 μm or less.

18 Claims, 11 Drawing Sheets

(58) Field of Classification Search
USPC .......................................................... 174/260
See application file for complete search history.

(56) References Cited

U.S. PATENT DOCUMENTS

| | | | |
|---|---|---|---|
| 2019/0013443 A1 | 1/2019 | Nakabayashi et al. | |
| 2019/0259634 A1 | 8/2019 | Wang et al. | |
| 2020/0161204 A1* | 5/2020 | Kim | H01L 23/3128 |
| 2020/0176364 A1* | 6/2020 | Park | H01L 23/3157 |
| 2020/0287095 A1 | 9/2020 | Nakabayashi et al. | |

FOREIGN PATENT DOCUMENTS

| | | | |
|---|---|---|---|
| JP | 2007109904 A | * | 4/2007 |
| JP | 2007-149775 A | | 6/2007 |
| KR | 10-2019-0005802 A | | 1/2019 |

OTHER PUBLICATIONS

May 16, 2023 International Preliminary Report on Patentabiity issued in International Patent Application No. PCT/JP2021/041912.

* cited by examiner

Fig. 11

| | h1 | h2 | h2-h1 | h3 | d2 | d1 | d1-d2 | d5-s | d5-l | CONSTITUENT MATERIAL | TEST METHOD | LED SURVIVAL RATE | REMAINING LED EMISSION RATE | POST-TEST OK RATE |
|---|---|---|---|---|---|---|---|---|---|---|---|---|---|---|
| EXAMPLE 1 | 4 | 5 | 1 | 1 | 15 | 16 | 1 | 8 | 16 | NOT INSTALLED | REPEATED DROP TEST | 100 | 95 | 95 |
| EXAMPLE 2 | 9 | 10 | 1 | 4 | 25 | 30 | 5 | 20 | 30 | NOT INSTALLED | REPEATED DROP TEST | 100 | 95 | 95 |
| EXAMPLE 3 | 9 | 10 | 1 | 4 | 25 | 35 | 10 | 25 | 35 | NOT INSTALLED | REPEATED DROP TEST | 90 | 90 | 81 |
| COMPARATIVE EXAMPLE 1 | 9 | 10 | 1 | 4 | 25 | 45 | 20 | 35 | 45 | NOT INSTALLED | REPEATED DROP TEST | 80 | 70 | 56 |
| EXAMPLE 4 | 9 | 12 | 3 | 4 | 25 | 30 | 5 | 20 | 30 | NOT INSTALLED | REPEATED DROP TEST | 95 | 95 | 90 |
| EXAMPLE 5 | 20 | 29 | 9 | 20 | 58 | 63 | 5 | 39 | 63 | NOT INSTALLED | REPEATED DROP TEST | 85 | 85 | 72 |
| EXAMPLE 6 | 15 | 29 | 14 | 20 | 58 | 68 | 10 | 44 | 68 | NOT INSTALLED | REPEATED DROP TEST | 80 | 80 | 64 |
| EXAMPLE 7 | 9 | 10 | 1 | 4 | 25 | 30 | 5 | 20 | 30 | INSTALLED | REPEATED DROP TEST | 100 | 98 | 98 |

MOUNTING BOARD AND CIRCUIT BOARD

TECHNICAL FIELD

The present invention relates to a mounting board and a circuit board.

BACKGROUND ART

There are electrical products such as smartphones, smartwatches, and portable gaming consoles, and the electrical products are becoming increasingly important. Electronic components are used in many electrical products, and the electronic components are mounted on boards. Since many of these electrical products are carried around, miniaturization has become extremely important, and in line with this, a demand for the miniaturization and thinning of the electronic components and the boards has become increased. To further advance the miniaturization and thinning, many techniques have been developed. For example, as in Patent Literature 1, there has been disclosed a technique of obtaining a thin board in which the mounting accuracy is improved by forming a recess, which has substantially the same size as an electronic component to be mounted, in one surface of a base material and by penetrating electrode terminals, which protrude to a wiring circuit formed on a back surface, through the base material and connecting the electrode terminals to the wiring circuit.

CITATION LIST

Patent Literature

Patent Literature 1: Japanese Unexamined Patent Publication No. 2003-197822

SUMMARY OF INVENTION

Technical Problem

In recent years, as mounting components have become miniaturized, the strength of the components themselves may have become weaker. For this reason, the reliability of a mounting board may have decreased against an external force or shock. Therefore, even when mounting components have become miniaturized, there is a demand for a mounting board with high reliability.

An object of the present invention is to provide a mounting board and a circuit board that can improve reliability.

Solution to Problem

According to the present invention, there is provided a mounting board including an electronic component including at least a pair of first terminals, and a circuit board including at least a pair of second terminals. The first terminals and the second terminals are electrically joined by a joining material containing a metal element, the electronic component and the joining material are disposed within a wall made of an insulator, a lower surface of the electronic component is lower than an upper surface of the wall, and when long sides of a region surrounded by the wall have a dimension d1 and long sides of the electronic component have a dimension d2, a value of (dimension d1−dimension d2) is 10 μm or less.

In the mounting board according to the present invention, the electronic component and the joining material are disposed within the wall made of an insulator, thereby being surrounded by the wall. Accordingly, a shock buffering structure by the wall can be provided around the electronic component and the joining material. Further, since the value of (dimension d1−dimension d2) is set to 10 μm or less, the gap between the electronic component and the wall can be sufficiently reduced. Therefore, when the mounting board receives an external force in a long side direction of the electronic component, the wall can easily protect the electronic component. As a result, the reliability of the mounting board can be improved.

A constituent material may be disposed between the wall and both the electronic component and the joining material. Accordingly, the force applied to the electronic component, the joining material, or the terminals can be reduced, and the reliability can be improved.

The constituent material may exist above the upper surface of the wall. Accordingly, the electronic component is surrounded from a position above the upper surface of the wall by the constituent material, so that the force applied to the electronic component can be further reduced and the reliability can be improved.

A first spacer lower than the upper surface of the wall may be disposed between the pair of second terminals. In such a manner, since the first spacer exists between the terminals, it becomes difficult for the force, which is applied to the electronic component, to be applied to the joining material, and the reliability can be improved.

A second spacer lower than the upper surface of the wall may be disposed on an inner periphery of the wall. Since the second spacer exists between the terminals and the wall, it becomes difficult for the force, which is applied to the electronic component, to be applied to the joining material, and the reliability can be improved.

When a height of the upper surface of the wall is defined as a dimension h1, and a height of an upper surface of the electronic component is defined as a dimension h2, a value of (dimension h2−dimension h1) may be 9 μm or less. Since the height relationship between the electronic component and the wall is set within such a range, it becomes difficult for a force to be applied to the electronic component, and the reliability can be improved.

There may be a step at a lower portion of the electronic component, and a constituent material may be disposed between the lower portion and the circuit board. The portion of the step and the constituent material are in contact with each other, so that the force applied to the electronic component can be further reduced and the reliability can be improved.

Inner surfaces of the wall may have a tapered shape. When a thermal shock is applied due to a difference in thermal expansion coefficient between the wall and the board, a force is applied from the wall to the joining material; however, since the inner surfaces of the wall have a tapper shape, it becomes difficult for a force to be applied from the wall on an electronic component side to the joining material, and it becomes difficult for the electronic component to peel off from the circuit board in a thermal shock test.

According to the present invention, there is provided a circuit board including at least a pair of second terminals. A joining material containing a metal element is disposed on the second terminals, the pair of second terminals and the joining material are disposed within a wall made of an insulator, when a total height of the second terminal and the joining material is defined as a dimension h3, the dimension h3 is 1 µm to 20 µm, and when a width of a space formed by the wall is defined as a dimension d5, the dimension d5 is 8 µm to 68 µm.

According to the circuit board of the present invention, when the electronic component is mounted, it is possible to obtain the mounting board that exhibits the same actions and effects as described above.

Advantageous Effects of Invention

According to the present invention, it is possible to provide the mounting board and the circuit board that can improve reliability.

BRIEF DESCRIPTION OF DRAWINGS

FIG. 11 is a table showing measurement conditions and test results of examples and a comparative example.

DESCRIPTION OF EMBODIMENTS

Figure 1:
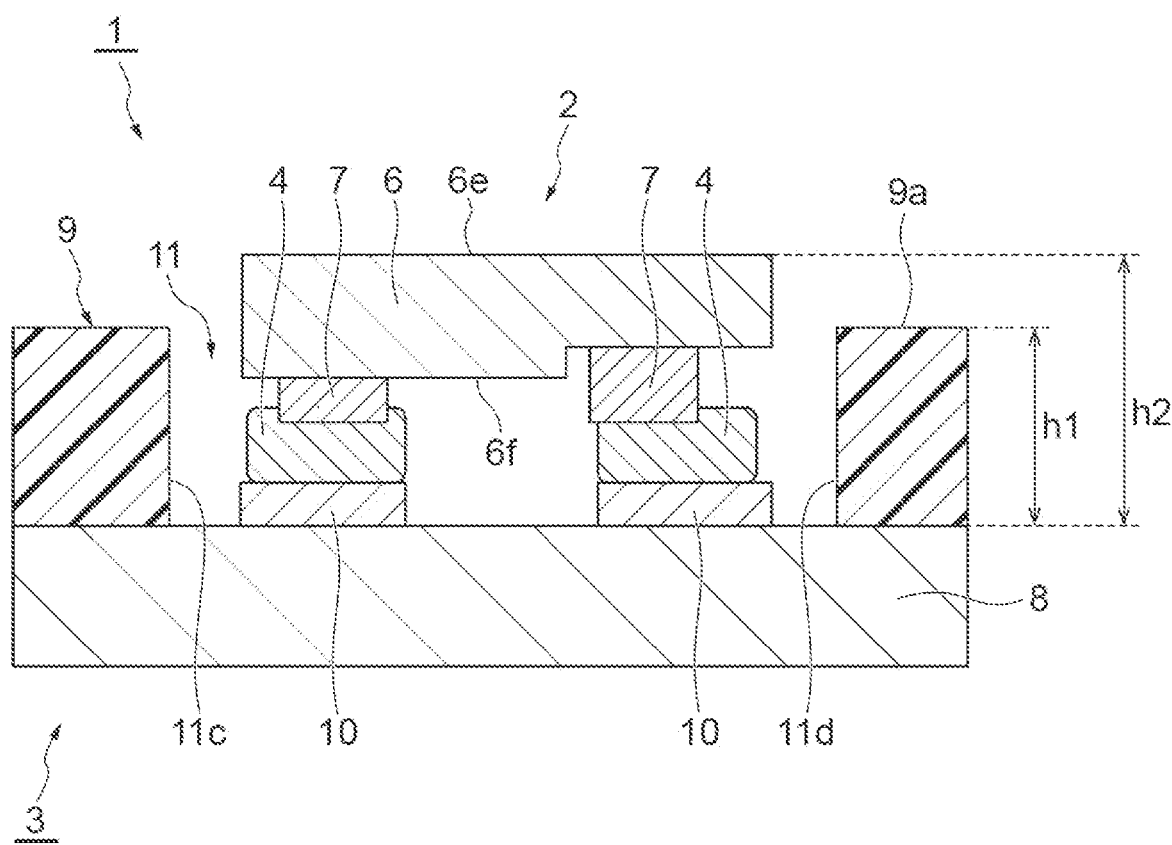
FIG. 1 is a schematic cross-sectional view showing a mounting board according to an embodiment of the present invention.

A mounting board 1 according to an embodiment of the present invention will be described with reference to FIG. 1. FIG. 1 is a schematic cross-sectional view showing the mounting board 1 according to the embodiment of the present invention. As shown in FIG. 1, the mounting board 1 includes an electronic component 2 and a circuit board 3. The mounting board 1 is configured by mounting the electronic component 2 onto the circuit board 3 through a joining material 4.

The electronic component 2 includes a body portion 6 and a pair of terminals 7 (first terminals). The body portion 6 is a member that performs the function of the electronic component 2. The terminals 7 are metal portions formed on a main surface of the body portion 6. Cu, Ti, Au, Ni, Sn, Bi, P, B, In, Ag, Zn, Pd, Mo, Pt, Cr, an alloy of at least two selected from these elements, or the like is adopted as the material of the terminals 7. The electronic component 2 is composed of, for example, a micro-LED or the like. The micro-LED is a component that emits light in response to an input from the circuit board 3.

The circuit board 3 includes a base material 8, a wall 9, and a pair of terminals 10 (second terminals). The base material 8 is a flat plate-shaped body portion of the circuit board 3. The wall 9 is a resin layer formed on an upper surface of the base material 8. For example, epoxy resin, acrylic resin, phenolic resin, melamine resin, urea resin, alkyd resin, SiOx, ceramics, or the like is adopted as the material of the wall 9. Particularly preferably, epoxy resin or acrylic resin is adopted as the material of the wall 9. The terminals 10 are metal portions formed on a main surface of the base material 8. Ni, Cu, Ti, Cr, Al, Mo, Pt, Au, an alloy of at least two selected from these elements, or the like is adopted as the material of the terminals 10.

The joining material 4 is a member that electrically joins the terminal 7 of the electronic component 2 and the terminal 10 of the circuit board 3. The joining material 4 contains metal elements and is made of an alloy containing metal elements. The joining material 4 is made of an alloy containing, for example, Sn, Bi, Au, and the like as the metal elements. The joining material 4 functions as a solder. Accordingly, the terminal 10, the joining material 4, and the terminal 7 are stacked in order from the upper surface of the base material 8 between the base material 8 and the body portion 6. Incidentally, soldering is performed at this location after the terminal 10, the joining material 4, and the terminal 7 are stacked. Therefore, a structure is formed in which the respective metals of the terminal 10, the joining material 4, and the terminal 7 are melted and diffused. The structure after such soldering may be a structure containing a brittle intermetallic compound (IMC). When the intermetallic compound with a brittle structure exists, reliability is likely to decrease. For this reason, the effect of a structure in which the soldered structure is surrounded by the wall 9 made of resin becomes more prominent.

A pair of recesses 11 are formed in the wall 9. The recess 11 is composed of a through-hole penetrating through the wall 9. Accordingly, the upper surface of the base material 8 is exposed on a bottom side of the recess 11. The recess 11 has a rectangular shape as viewed in a thickness direction of the circuit board 3 (refer to FIG. 2). A lower surface 6f of the body portion 6 of the electronic component 2 is lower than an upper surface 9a of the wall 9. The electronic component 2, the joining material 4, and the terminal 10 are disposed within the recess 11 formed in the wall 9, thereby being surrounded by the wall 9.

Figure 2:
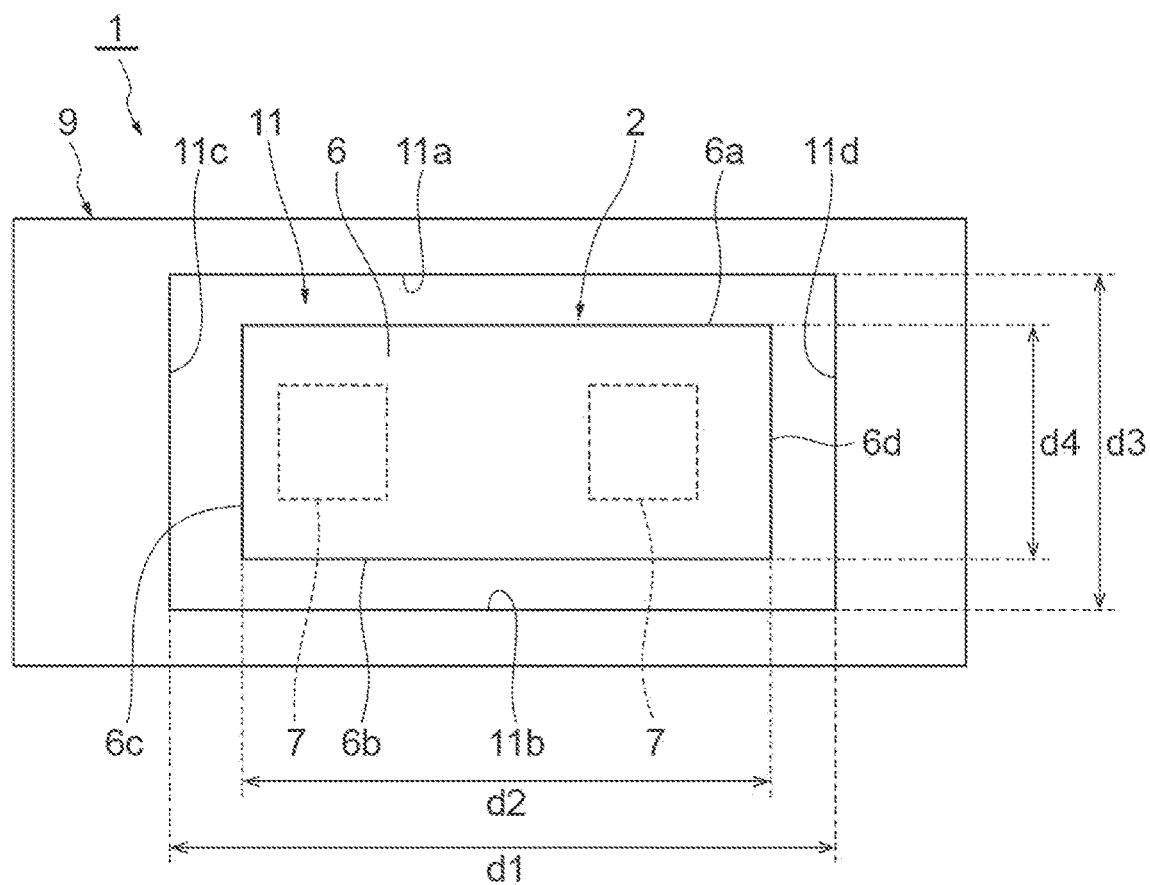
FIG. 2 is a schematic plan view of the mounting board as viewed from above.

FIG. 2 is a schematic plan view of the mounting board 1 as viewed from above. As shown in FIG. 2, the recess 11 of the wall 9 has a pair of long sides 11a and 11b and a pair of short sides 11c and 11d. Accordingly, a region surrounded by the wall 9 is defined by each of the sides 11a, 11b, 11c, and 11d. The body portion 6 of the electronic component 2 has a pair of long sides 6a and 6b and a pair of short sides 6c and 6d. A slight gap is formed between each of the sides 11a, 11b, 11c, and 11d of the recess 11 and each of the corresponding sides 6a, 6b, 6c, and 6d of the body portion 6. As shown in FIG. 1, a slight gap is formed between the short side 11c of the recess 11 and all of one terminal 7, the joining material 4, and the terminal 10. A slight gap is formed between the short side 11d of the recess 11 and all of the other terminal 7, the joining material 4, and the terminal 10.

Next, a dimensional relationship of each element of the mounting board 1 will be described with reference to FIGS. 1 and 2. Incidentally, in the following description, when simply "height" is referred to, the height is a height with respect to the upper surface of the base material 8. As shown in FIG. 1, a height of the upper surface 9a of the wall 9 is defined as a dimension h1, and a height of an upper surface 6e of the body portion 6 of the electronic component 2 is defined as a dimension h2. In this case, the dimension h1 is preferably 3 µm or more, more preferably 4 µm or more. In addition, the dimension h1 is preferably 30 µm or less, more preferably 15 μm or less. The dimension h2 is preferably 9 μm or more, more preferably 10 μm or more. In addition, the dimension h2 is preferably 39 μm or less, more preferably 15 μm or less. The value of (dimension h2−dimension h1) is preferably 9 μm or less, more preferably 6 μm or less. The lower limit value of (dimension h2−dimension h1) is not particularly limited, and unless manufacturing is affected, the lower limit value may be set to 0 μm or the lower limit value may be set to −3 μm. Incidentally, the dimensions h1 and h2 can be measured by vertically cutting the mounting board 1 and observing a cross section with an SEM.

As shown in FIG. 2, the region surrounded by the wall 9, namely, the long sides 11a and 11b of the recess 11 have a dimension d1, and the long sides 6a and 6b of the body portion 6 of the electronic component 2 have a dimension d2. In this case, the dimension d1 is preferably 8 μm or more, more preferably 16 μm or more. In addition, the dimension d1 is preferably 68 μm or less, more preferably 35 μm or less. The dimension d2 is preferably 7 μm or more, more preferably 15 μm or more. In addition, the dimension d2 is preferably 58 μm or less, more preferably 25 μm or less. The value of (dimension d1−dimension d2) is preferably 10 μm or less, more preferably 6 μm or less. The lower limit value of (dimension d1−dimension d2) is not particularly limited, and unless manufacturing is affected, the lower limit value may be set to 0 μm.

The region surrounded by the wall 9, namely, the short sides 11c and 11d of the recess 11 have a dimension d3, and the short sides 6c and 6d of the body portion 6 of the electronic component 2 have a dimension d4. In this case, the dimension d3 is preferably 5 μm or more, more preferably 9 μm or more. In addition, the dimension d3 is preferably 44 μm or less, more preferably 35 μm or less. The dimension d4 is preferably 4 μm or more, more preferably 8 μm or more. In addition, the dimension d4 is preferably 58 μm or less, more preferably 25 μm or less. A value of (dimension d3−dimension d4) is preferably 10 μm or less, more preferably 6 μm or less. The lower limit value of (dimension d3−dimension d4) is not particularly limited, and unless manufacturing is affected, the lower limit value may be set to 0 μm.

A corner R may be formed at the corners of the recess 11 of the wall 9 or at the corners of the body portion 6, the terminals 7, and the terminals 10. The corner R may be set to, for example, 1 μm, 5 μm, 10 μm, or the like.

As shown in FIG. 2, when the recess 11 of the wall 9 has an oblong shape, the dimension of long sides corresponds to the dimension d1. When the recess 11 of the wall 9 has a square shape, the dimension of both sides corresponds to the dimension d1. When the recess 11 of the wall 9 has a circular shape, the diameter corresponds to the dimension d1. When the recess 11 of the wall 9 has an elliptical shape, the major axis corresponds to the dimension d1. When the recess 11 of the wall 9 has a polygonal shape that is a pentagonal or higher shape, the distance between each vertex and a side facing the vertex is measured, and the longest distance is defined as the dimension d1. Incidentally, a method for determining the dimension d2 based on the shape of the body portion 6 is the same as for the dimension d1.

Next, a method for manufacturing the mounting board 1 and a configuration of the circuit board 3 in the manufacturing process will be described.

Figure 3:
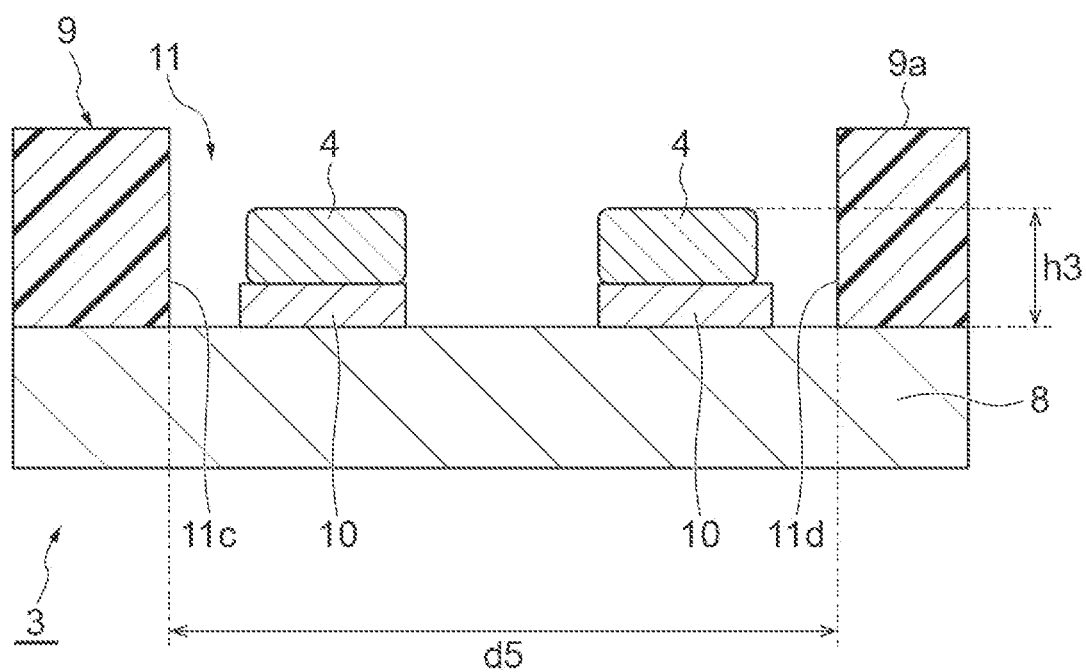
FIG. 3 is a schematic cross-sectional view showing a circuit board according to the embodiment of the present invention.

First, the circuit board 3 as shown in FIG. 3 is prepared. In this state, the joining material 4 is disposed on the terminal 10. Since the joining material 4 is in a pre-joining state before being joined to the electronic component 2, the joining material 4 is at least thicker than the joining material 4 in the state of the mounting board 1 shown in FIG. 1. The joining material 4 may be a metal containing low-temperature soldering metal elements, and the overall composition may have any microstructure as long as the overall composition has a low melting point. For example, at the stage of distributing the circuit board 3, the joining material 4 may have a laminated structure including two or more metal layers. Alternatively, the circuit board 3 may be distributed in a state where the circuit board 3 is heated in advance and made into an alloy consisting of two or more metals.

In this state, the terminal 10 and the joining material 4 are disposed within the recess 11 formed in the wall 9, thereby being surrounded by the wall 9. When the total thickness of the terminal 10 and the joining material 4 is a dimension h3, the dimension h3 is preferably 1 μm or more, more preferably 3 μm or more. The dimension h3 is preferably 20 μm or less, more preferably 9 μm or less. A width of a space formed by the wall 9 is defined as a dimension d5. The space formed by the wall 9 corresponds to an internal space of the recess 11. Consequently, the width of the space is defined by a width of the recess 11. The dimension d5 is preferably 8 μm or more, more preferably 16 μm or more. In addition, the dimension d5 is preferably 68 μm or less, more preferably 35 μm or less.

The electronic component 2 is placed on the circuit board 3. At this time, the pair of terminals 7 of the electronic component 2 are each placed on a pair of the joining materials 4. Soldering is performed by heating the circuit board 3 and the electronic component 2 in this state. The heating method may be any of a reflow method in which the circuit board 3 and the electronic component 2 are put into a furnace or the like and are heated, a thermocompression joining method in which heating is performed while pressing the electronic component 2, and a light heating method in which heating is performed by applying light, or may be a combination of these methods. As a result, the electronic component 2 is mounted on the circuit board 3 and the mounting board 1 is completed.

Actions and effects of the mounting board 1 and the circuit board 3 according to the present embodiment will be described.

In the mounting board 1, the electronic component 2 and the joining materials 4 are disposed within the wall 9 made of an insulator, thereby being surrounded by the wall 9. Accordingly, a shock buffering structure by the wall 9 can be provided around the electronic component 2 and the joining materials 4. Further, since the value of (dimension d1−dimension d2) is set to 10 μm or less, the gap between the electronic component 2 and the wall 9 can be sufficiently reduced. Therefore, when the mounting board 1 receives an external force in a long side direction of the electronic component 2, the wall 9 can easily protect the electronic component 2. As a result, the reliability of the mounting board 1 can be improved.

When the height of the upper surface 9a of the wall 9 is defined as the dimension h1 and the height of the upper surface 6e of the electronic component 2 is defined as the dimension h2, the value of (dimension h2−dimension h1) may be 9 μm or less. Since the height relationship between the electronic component 2 and the wall 9 is set within such a range, it becomes difficult for a force to be applied to the electronic component 2, and the reliability can be improved.

According to the circuit board 3 of the present embodiment, when the electronic component 2 is mounted, it is possible to obtain the mounting board 1 that exhibits the same actions and effects as described above.

The present invention is not limited to the above-described embodiment.

Figure 4:
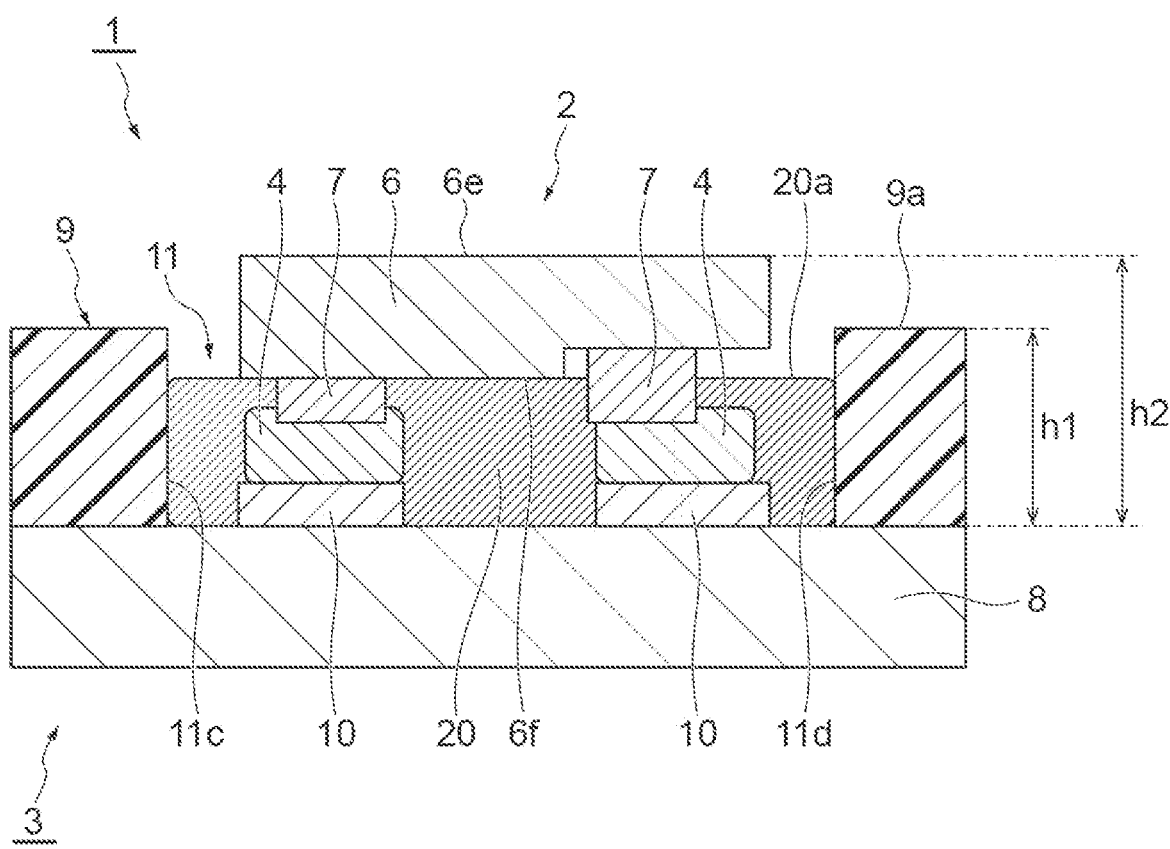
FIG. 4 is a schematic cross-sectional view showing a mounting board according to a modification example.

For example, as shown in FIG. 4, a constituent material 20 may be disposed between the wall 9 and both the electronic component 2 and the joining material 4. Accordingly, the electronic component 2 is supported by the constituent material 20, so that the electronic component 2 can be made less likely to peel off from the circuit board 3. In addition, the force applied to the electronic component 2, the joining material 4, or the terminals 7 and 10 can be reduced, and the reliability can be improved. In the example shown in FIG. 4, an upper surface 20a of the constituent material 20 is disposed at a position lower than that of the upper surface 9a of the wall 9. For example, epoxy resin, acrylic resin, phenolic resin, melamine resin, urea resin, alkyd resin, SiOx, ceramics, or the like is adopted as the material of the constituent material 20. Particularly preferably, epoxy resin or acrylic resin is adopted as the material of the constituent material 20.

Figure 5:
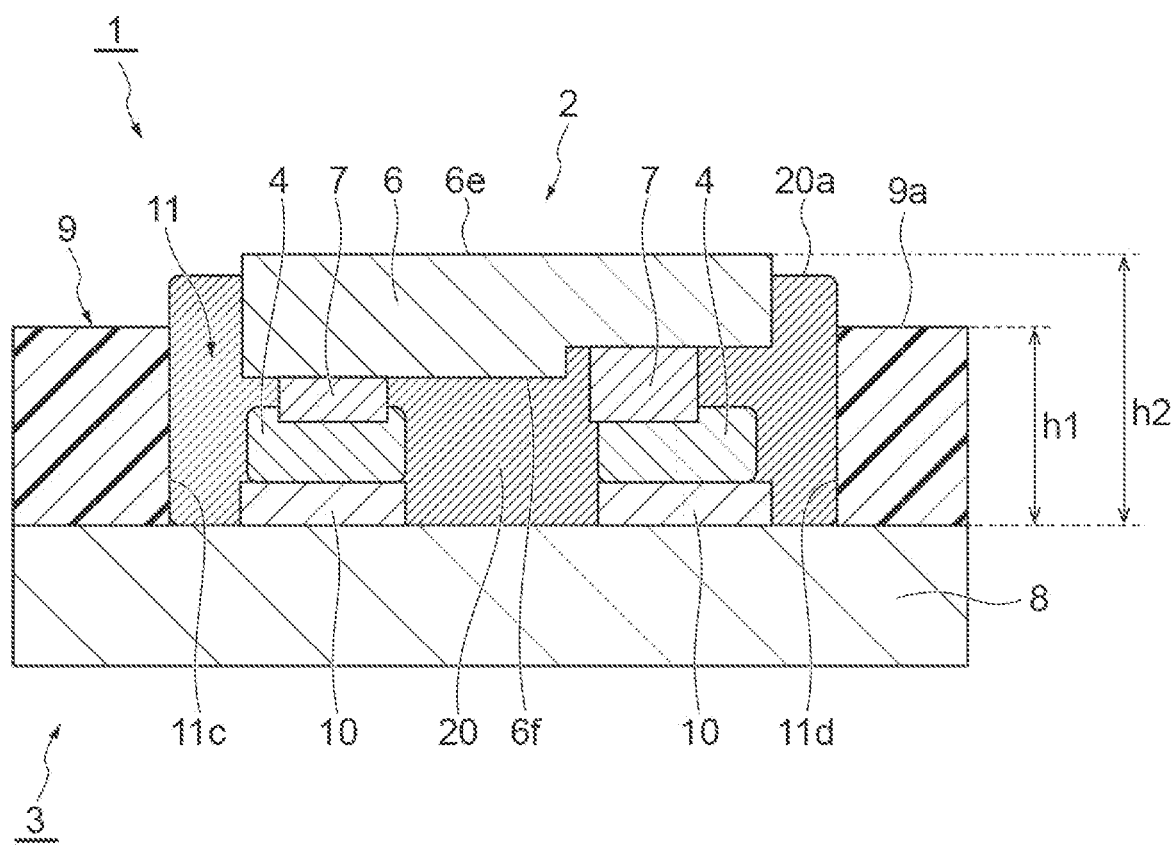
FIG. 5 is a schematic cross-sectional view showing a mounting board according to a modification example.

As shown in FIG. 5, the constituent material 20 may exist above the upper surface 9a of the wall 9. The upper surface 20a of the constituent material 20 is disposed above the upper surface 9a of the wall 9. Accordingly, the electronic component 2 is surrounded from a position above the upper surface 9a of the wall 9 by the constituent material 20, so that the force applied to the electronic component 2 can be further reduced and the reliability can be improved.

Figure 6A:
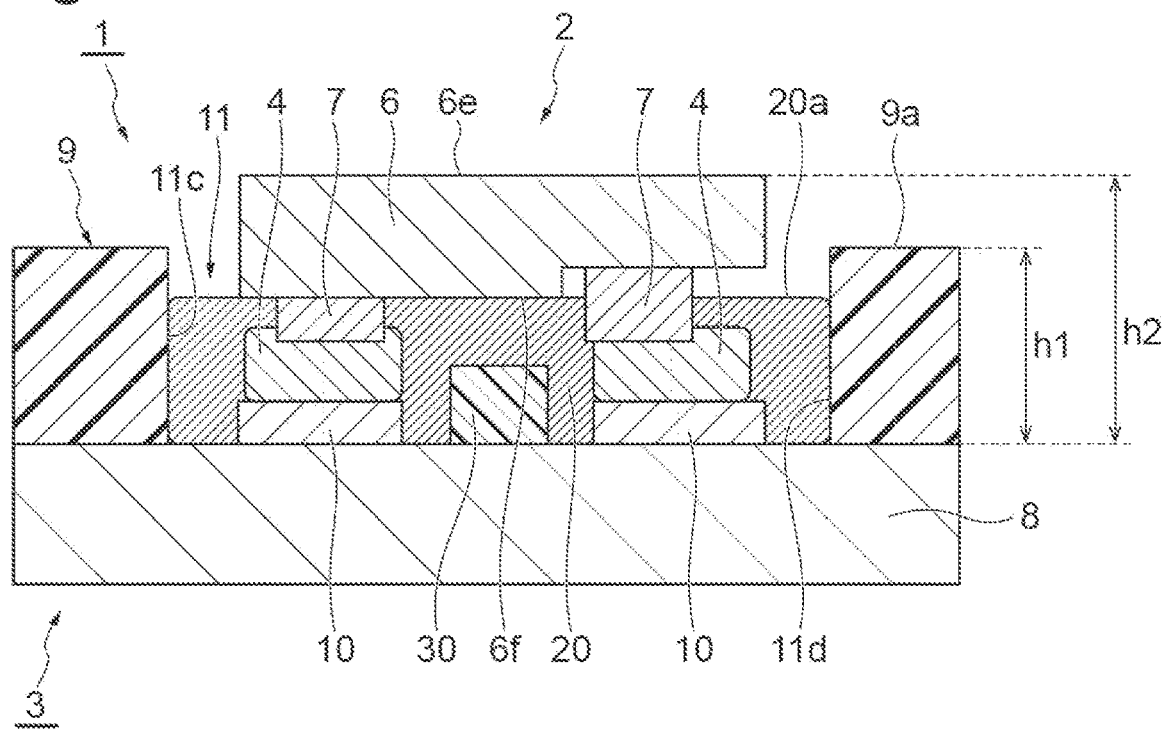
FIG. 6 is a schematic cross-sectional view showing a mounting board according to a modification example.
Figure 6B:
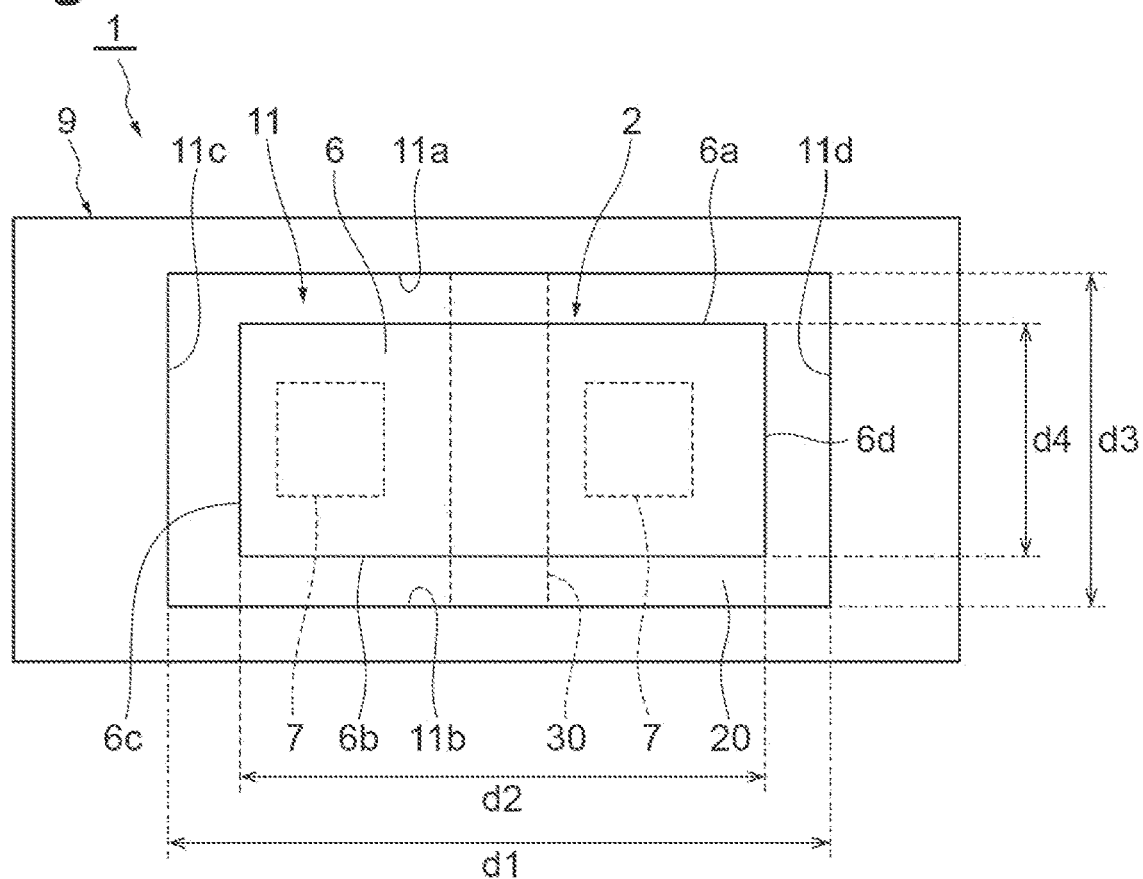

As shown in FIG. 6(a), a spacer 30 (first spacer) lower than the upper surface 9a of the wall 9 may be disposed between the pair of terminals 10. As shown in FIG. 6(a), the spacer 30 extends from one long side 11a of the wall 9 to the other long side 11b. However, the length of the spacer 30 is not particularly limited. In such a manner, since the spacer 30 exists between the terminals 10, it becomes difficult for the force, which is applied to the electronic component 2, to be applied to the joining materials 4, and the reliability can be improved.

Figure 7:
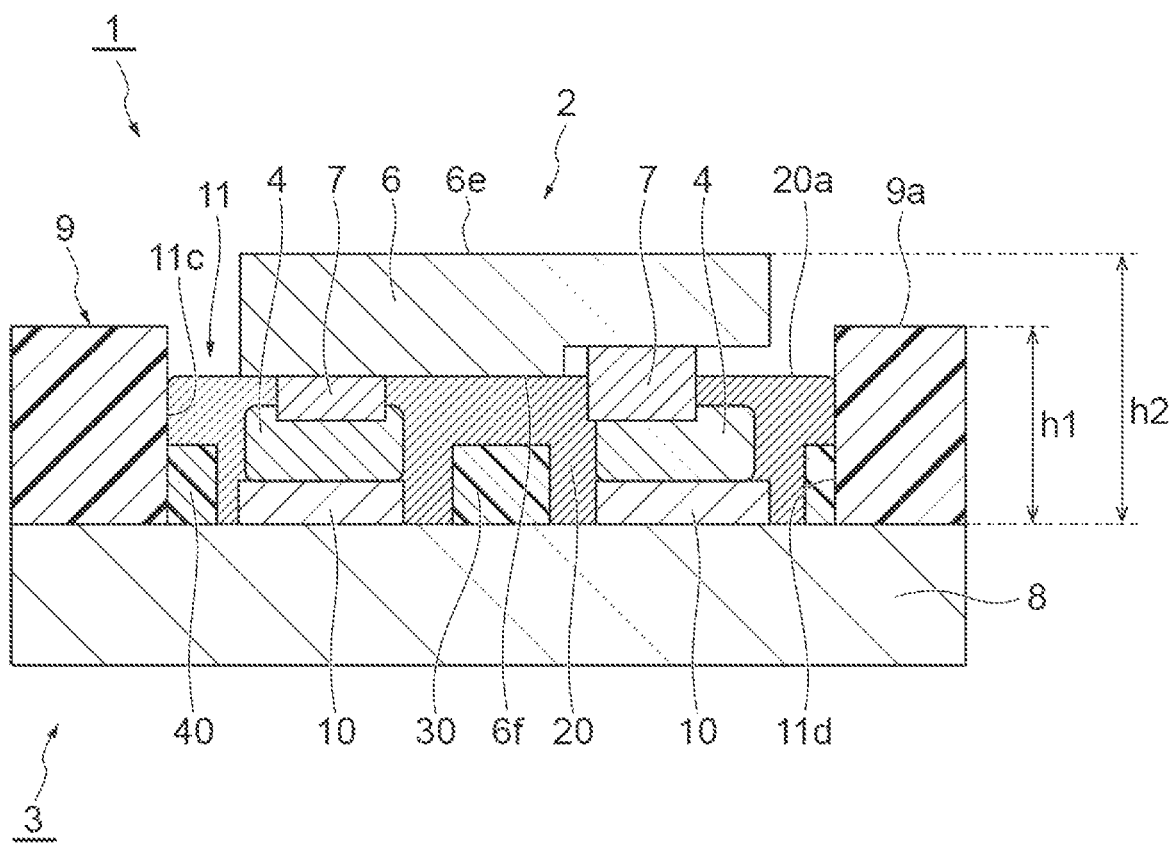
FIG. 7 is a schematic cross-sectional view showing a mounting board according to a modification example.

As shown in FIG. 7, a spacer 40 (second spacer) lower than the upper surface 9a of the wall 9 may be disposed on an inner periphery of the wall 9. Since the spacer 40 exists between the terminals 10 and the wall 9, it becomes difficult for the force, which is applied to the electronic component 2, to be applied to the joining materials 4, and the reliability can be improved. The spacer 40 may be provided over the entire inner periphery of the wall 9 or may be partially provided. The same material as for the constituent material 20 may be adopted as the materials of the spacers 30 and 40. A width dimension of the spacers 30 and 40 may be 10 μm or less, more preferably 9 μm or less. Incidentally, in terms of the relationship between materials' hardness, a relationship of "base material 8>wall 9≥spacers 30 and 40≥constituent material 20" may be established.

Figure 8:
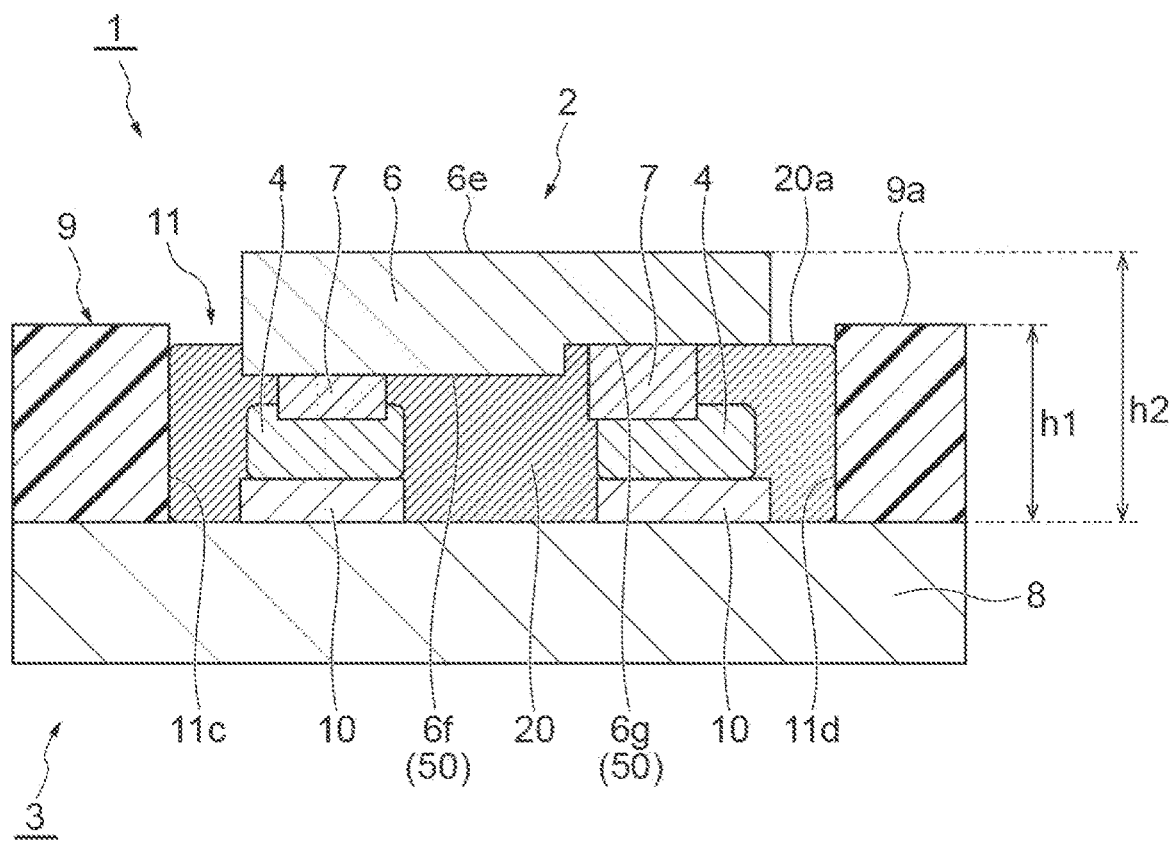
FIG. 8 is a schematic cross-sectional view showing a mounting board according to a modification example.

As shown in FIG. 8, a step 50 is formed at a lower portion of the body portion 6 of the electronic component 2 by the lower surface 6f and a stepped surface 6g. The constituent material 20 is disposed between the lower portion and the circuit board 3. The upper surface 20a of the constituent material 20 reaches the lower surface 6f and the stepped surface 6g. The portion of the step 50 and the constituent material 20 are in contact with each other, so that the force applied to the electronic component 2 can be further reduced and the reliability can be improved.

Figure 9A:
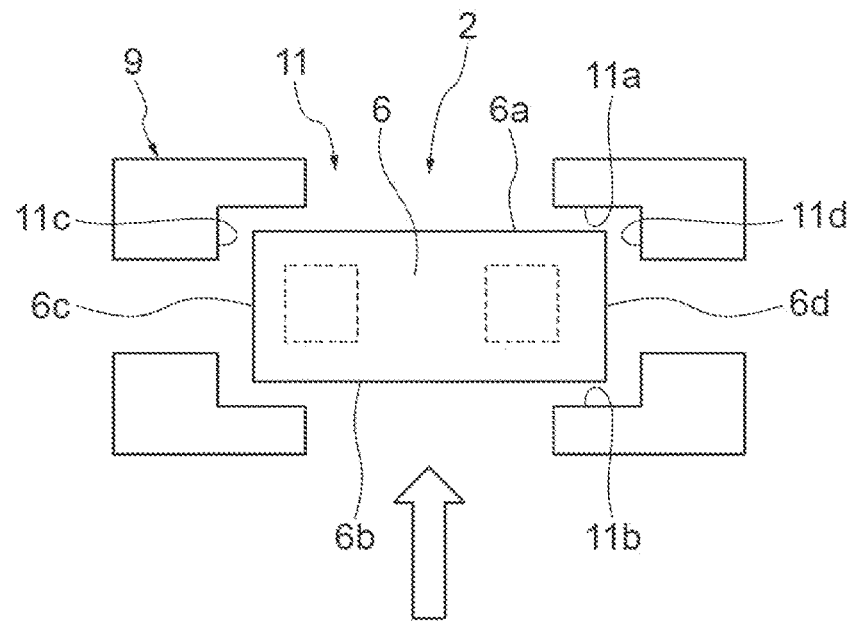
FIG. 9 is a schematic cross-sectional view showing a mounting board according to a modification example.
Figure 9B:
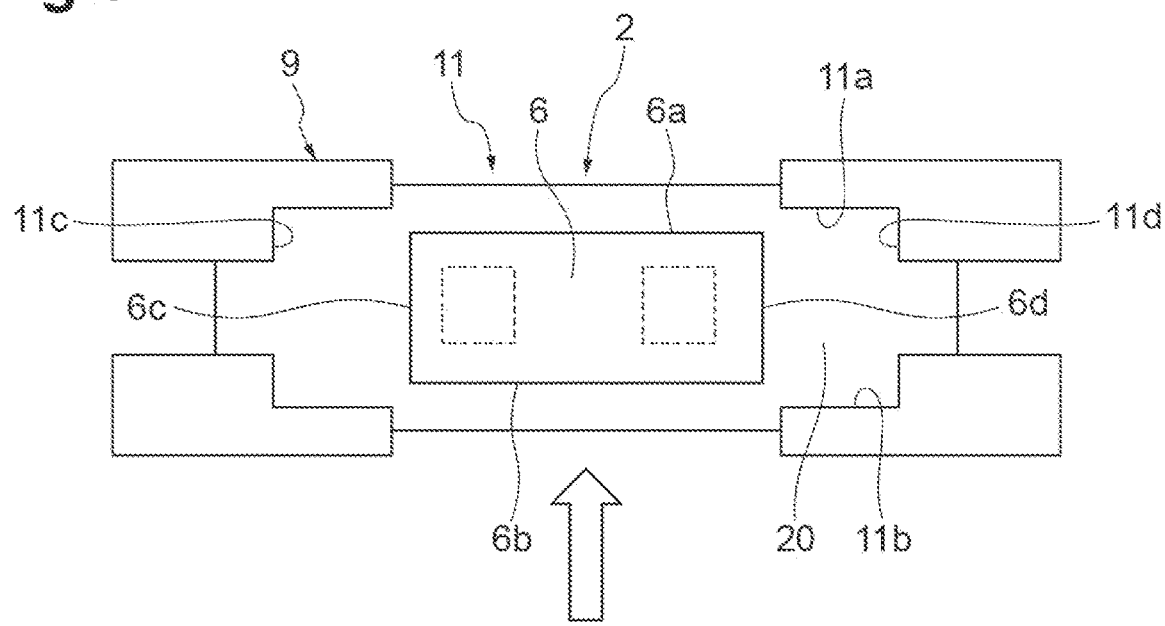

As shown in FIG. 9, four wall surfaces of the wall 9 may not be connected to each other. In that case, as shown in FIG. 9(a), when the wall 9 (portions corresponding to the long sides 11a and 11b) interposing the long sides 6a and 6b of the electronic component 2 is projected onto the electronic component 2, it is sufficient if portions of the wall 9 overlap the short sides 6c and 6d of the electronic component 2. The same applies to the wall surfaces on a short side 11c side and a short side 11d side. However, as shown in FIG. 9(b), when the constituent material 20 is provided, the short sides 11c and 11d between the above-described projection and the electronic component 2 may not overlap each other, but a structure needs to be implemented in which the constituent material 20 is caught on the wall 9.

In addition, in the above-described embodiment, one electronic component 2 is disposed inside the wall 9, but a plurality of the electronic components 2 may be disposed. The disposition mode of the plurality of electronic components 2 is not particularly limited.

Figure 10:
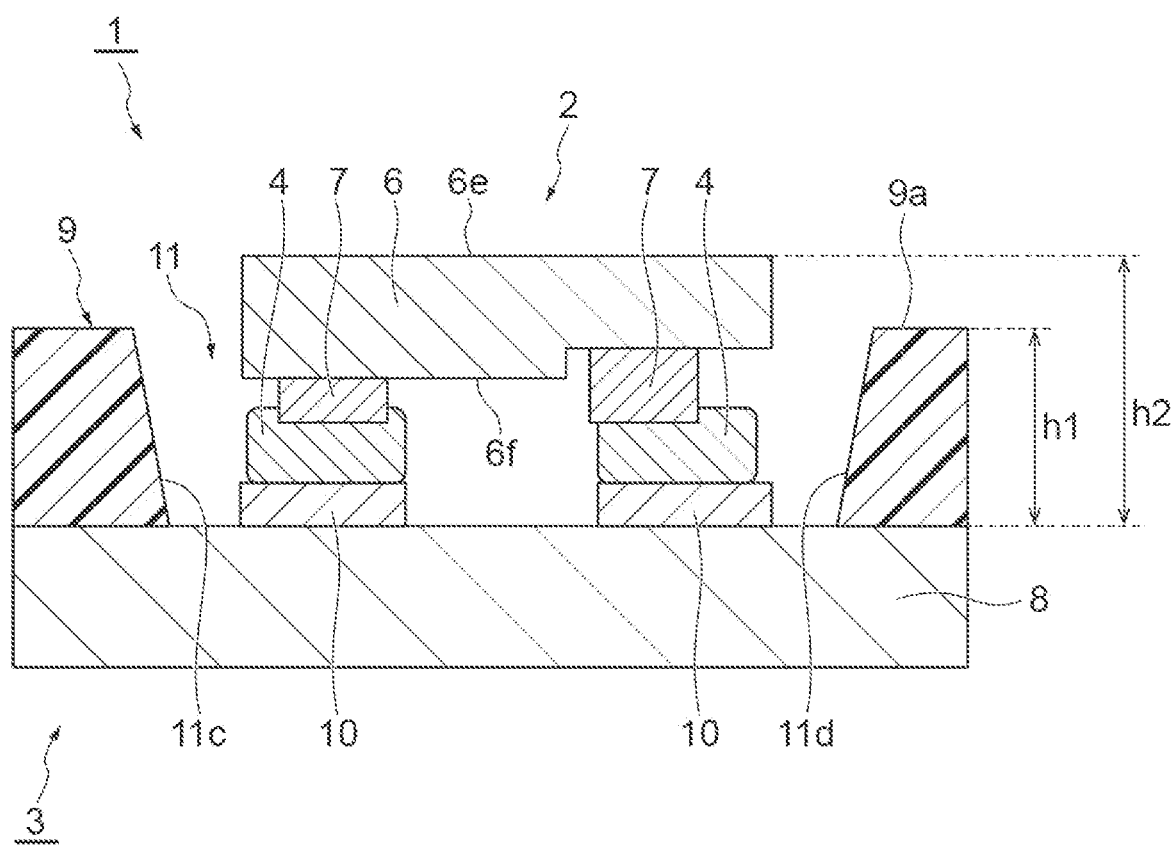
FIG. 10 is a schematic cross-sectional view showing a mounting board according to a modification example.

In addition, as shown in FIG. 10, inner surfaces of the wall 9 corresponding to each of the sides 11a, 11b, 11c, and 11d of the recess 11 may have a tapered shape that widens toward an electronic component 2 side. When a thermal shock is applied due to a difference in thermal expansion coefficient between the wall 9 and the base material 8, a force is applied from the wall 9 to the joining materials 4, however, since the inner surfaces of the wall 9 have a tapper shape, it becomes difficult for a force to be applied from the wall 9 on the electronic component 2 side to the joining materials 4, and it becomes difficult for the electronic component 2 to peel off from the circuit board 3 in a thermal shock test. Incidentally, when the width of the recess 11 is defined as the dimension d5 (refer to FIG. 3), the width dimension at an upper end of the recess 11 (namely, the position of the upper surface of the wall 9) is defined as the dimension d5. Namely, the dimension d5 is determined at the location where the width dimension of the recess 11 is the largest.

EXAMPLES

Examples of the mounting board according to the present disclosure will be described. Incidentally, the present disclosure is not limited to the following examples.

First, mounting boards of Examples 1 to 7 and Comparative Example 1 were fabricated using the following various manufacturing methods. First, the base material 8 on which the terminals 10 were formed was prepared. A glass epoxy board was adopted as the base material 8. A Cu terminal coated with a Ni film was adopted as the terminal 10. 100 pairs of the terminals 10 were formed on the base material 8. Next, as the joining material 4, a pair of Bi/Sn laminated pads were formed with a desired thickness on the terminal 10. A pair of the joining materials 4 were formed at 100 locations on the base material 8.

Next, the wall 9 was formed on the base material 8 to surround the terminals 10 and the joining materials 4. Epoxy resin was adopted as the material of the wall 9. Accordingly, the circuit board 3 as shown in FIG. 3 was obtained. Next, an LED chip was placed as the electronic component 2 on the circuit board 3. 100 LED chips were mounted on the circuit board 3. The LED chip includes Au terminals as the terminals 7. Next, the mounting board 1 was reflowed in this state at 150° C. to 190° C. Accordingly, the circuit board 3 and the electronic component 2 were joined. The dimensions and the presence or absence of the constituent material of Examples 1 to 7 and Comparative Example 1 are shown in the table of FIG. 11. Incidentally, in the table of FIG. 11, "d5-s" is a width dimension in a lateral direction of a space formed by the wall, and "d5-l" is a width dimension in a longitudinal direction of the space formed by the wall. "d5-l" corresponds to "d5" shown in FIG. 3.

The following various tests were performed on the above-described mounting boards of Examples 1 to 7 and Comparative Example 1. The obtained mounting boards were freely dropped 10 times from a height of 30 cm. Next, the ratio of the number of the remaining LED chips after the test to the total number of the LED chips on the mounting board before the test was examined as an "LED survival rate". The ratio of the number of the LED chips, which emit light, among the remaining LED chips was examined as a "remaining LED emission rate". Incidentally, the remaining LED emission rate of 50% or more was considered to be OK. In addition, the ratio of the number of the LED chips, which emit light, to the number of the LED chips before the test was examined as a "post-test OK rate". Test results at this time are shown in the table of FIG. 11.

First, in Comparative Example 1, since (dimension d1−dimension d2) was too wide, it could be confirmed that the LED chip was not protected from the shock of the test and the LED chip was easily detached from the circuit board. In contrast, in Examples 1 to 7, it was confirmed that there were many remaining LED chips and the ratio of the remaining LED chips capable of emitting light was also high.

From Examples 1, 2, and 3, it is understood that a part of the LED chip is brought into contact with the wall by setting (dimension d1−dimension d2) within a proper range, and the LED survival rate and the LED generation rate are increased by reducing the shock to the LED chip and the joint portion in the tests by means of the wall. From Example 4, it is understood that since (dimension h2−dimension h1) is larger than in Example 2, the contact between the LED chips and the walls is slightly reduced, and due to the shock of the LED chips being transmitted to the joining materials, the number of the LED chips capable of withstanding the test is slightly reduced. From Examples 5 and 6, it is understood that since (dimension h2−dimension h1) is much larger than in Example 4, the contact between the LED chips and the walls is slightly reduced, and due to the shock of the LED chips being transmitted to the joining materials, the number of the LED chips capable of withstanding the test is slightly reduced and the remaining LED emission rate is slightly reduced. From Example 7, it is understood that the results are good in all items.

REFERENCE SIGNS LIST

1: mounting board, 2: electronic component, 3: circuit board, 4: joining material, 6: body portion, 7: terminal (first terminal), 9: wall, 10: terminal (second terminal), 20: constituent material, 30: spacer (first spacer), 40: spacer (second spacer), 50: step.

The invention claimed is:

1. A mounting board comprising:
an electronic component including at least a pair of first terminals; and
a circuit board including at least a pair of second terminals,
wherein the first terminals and the second terminals are electrically joined by a joining material containing a metal element,
the electronic component and the joining material are disposed within a wall made of an insulator,
a lower surface of the electronic component is lower than an upper surface of the wall,
when long sides of a region surrounded by the wall have a dimension d1 and long sides of the electronic component have a dimension d2, a value of (dimension d1−dimension d2) is 10 μm or less, and
wherein a constituent material is disposed between the wall and both the electronic component and the joining material.

2. The mounting board according to claim 1,
wherein the constituent material exists above the upper surface of the wall.

3. The mounting board according to claim 2,
wherein a first spacer lower than the upper surface of the wall is disposed between the pair of second terminals.

4. The mounting board according to claim 2,
wherein a second spacer lower than the upper surface of the wall is disposed on an inner periphery of the wall.

5. The mounting board according to claim 2,
wherein when a height of the upper surface of the wall is defined as a dimension h1, and a height of an upper surface of the electronic component is defined as a dimension h2, a value of (dimension h2−dimension h1) is 9 μm or less.

6. The mounting board according to claim 2,
wherein there is a step at a lower portion of the electronic component, and a constituent material is disposed between the lower portion and the circuit board.

7. The mounting board according to claim 2,
wherein inner surfaces of the wall have a tapered shape.

8. The mounting board according to claim 1,
wherein when a height of the upper surface of the wall is defined as a dimension h1, and a height of an upper surface of the electronic component is defined as a dimension h2, a value of (dimension h2−dimension h1) is 9 μm or less.

9. The mounting board according to claim 1,
wherein inner surfaces of the wall have a tapered shape.

10. The mounting board according to claim 1,
wherein a first spacer lower than the upper surface of the wall is disposed between the pair of second terminals.

11. The mounting board according to claim 1,
wherein a second spacer lower than the upper surface of the wall is disposed on an inner periphery of the wall.

12. The mounting board according to claim 1,
wherein when a height of the upper surface of the wall is defined as a dimension h1, and a height of an upper surface of the electronic component is defined as a dimension h2, a value of (dimension h2−dimension h1) is 9 μm or less.

13. The mounting board according to claim 1,
wherein there is a step at a lower portion of the electronic component, and a constituent material is disposed between the lower portion and the circuit board.

14. The mounting board according to claim 1,
wherein inner surfaces of the wall have a tapered shape.

15. A mounting board comprising:
an electronic component including at least a pair of first terminals; and
a circuit board including at least a pair of second terminals,
wherein the first terminals and the second terminals are electrically joined by a joining material containing a metal element,
the electronic component and the joining material are disposed within a wall made of an insulator,
a lower surface of the electronic component is lower than an upper surface of the wall,
when long sides of a region surrounded by the wall have a dimension d1 and long sides of the electronic component have a dimension d2, a value of (dimension d1−dimension d2) is 10 μm or less, and wherein a first spacer lower than the upper surface of the wall is disposed between the pair of second terminals.

16. The mounting board according to claim 15,
wherein a second spacer lower than the upper surface of the wall is disposed on an inner periphery of the wall.

17. A mounting board comprising:
an electronic component including at least a pair of first terminals; and
a circuit board including at least a pair of second terminals,
wherein the first terminals and the second terminals are electrically joined by a joining material containing a metal element,
the electronic component and the joining material are disposed within a wall made of an insulator,
a lower surface of the electronic component is lower than an upper surface of the wall,
when long sides of a region surrounded by the wall have a dimension d1 and long sides of the electronic component have a dimension d2, a value of (dimension d1−dimension d2) is 10 μm or less, and
wherein a second spacer lower than the upper surface of the wall is disposed on an inner periphery of the wall.

18. A mounting board comprising:
an electronic component including at least a pair of first terminals; and
a circuit board including at least a pair of second terminals,
wherein the first terminals and the second terminals are electrically joined by a joining material containing a metal element,
the electronic component and the joining material are disposed within a wall made of an insulator,
a lower surface of the electronic component is lower than an upper surface of the wall,
when long sides of a region surrounded by the wall have a dimension d1 and long sides of the electronic component have a dimension d2, a value of (dimension d1−dimension d2) is 10 μm or less, and
wherein there is a step at a lower portion of the electronic component, and a constituent material is disposed between the lower portion and the circuit board.

* * * * *